United States Patent
Pyo et al.

(10) Patent No.: US 6,664,636 B2
(45) Date of Patent: Dec. 16, 2003

(54) CU FILM DEPOSITION EQUIPMENT OF SEMICONDUCTOR DEVICE

(75) Inventors: Sung Gvu Pyo, Kyonggi-do (KR); Si Bum Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/156,839

(22) Filed: May 30, 2002

(65) Prior Publication Data

US 2002/0187635 A1 Dec. 12, 2002

(30) Foreign Application Priority Data

Jun. 12, 2001 (KR) ......................... 2001-32907

(51) Int. Cl.⁷ .............................. H01L 23/48
(52) U.S. Cl. ....................... 257/762; 438/687
(58) Field of Search ................ 257/762, 751; 438/687

(56) References Cited

U.S. PATENT DOCUMENTS 6,362,099 B1 * 3/2002 Gandikota et al. .......... 438/687

* cited by examiner

*Primary Examiner*—David Nelms
*Assistant Examiner*—Quoc Hoang
(74) *Attorney, Agent, or Firm*—Birch, Stewart, Kolasch & Birch, LLP

(57) ABSTRACT

A Cu thin film deposition equipment of a semiconductor device is disclosed for improving deposition speed of a Cu thin film and lowering its corresponding cost. This equipment includes a load lock carrying out the steps before and after wafer processes, an aligner carrying out alignment so that a wafer reaches a desired position, a de-gas chamber removing residue such as gas produced on a surface of a wafer, and a feeding chamber provided with a robot placing the wafer in/out of each chamber. A pre-cleaning chamber cleaning the inside and the outside of a pattern using plasma on a wafer fed by the feeding chamber, a barrier metal deposition chamber, an adhesion glue layer (AGL) flash Cu deposition chamber, a CECVD deposition chamber, and a plasma treatment chamber are also provided with the equipment.

18 Claims, 6 Drawing Sheets

CU FILM DEPOSITION EQUIPMENT OF SEMICONDUCTOR DEVICE

CROSS-REFERENCES TO RELATED APPLICATIONS

This nonprovisional application claims priority under 35 U.S.C. §119(a) on Patent Application No. P2001-32907 filed in Korea on Jun. 12, 2001, the entirety of which is herein incorporated by reference.

BACKGROUND OF THE INVENTION

1. Field of the Invention

The present invention relates to deposition equipment for a semiconductor device, and more particularly, to Cu film deposition equipment for a semiconductor device that enables catalyst deposition according to a chemical enhancer (CE) treatment and a plasma treatment for an equal super-filling.

2. Description of the Background Art

With the enhanced performance of semiconductor memory devices, increases in speed and reliability of semiconductor devices are major concerns for designers. Current Cu linings, which are used to increase the speed and reliability of semiconductor devices, use electroplating as a deposition method. However, the electroplating deposition method requires a thin film deposition process of a clean and safe Cu seed layer. Accordingly, the electroplating method depends highly on the seed layer and may be limited in a Tech level of 0.1 $\mu$m.

Therefore, it is advantageous to use a metal organic chemical vapor deposition (MOCVD) process in Cu line structures of advanced generation semiconductor devices. Due to the rapid enhancement of these semiconductor devices, decreases in contact size and a rapid increase in aspect ratio are expected. However, the related art Cu film deposition equipment suffers from the following disadvantages.

In the case where a Cu thin film is deposited by the MOCVD process, a problem arises in that it is cumbersome in commercial use due to its relatively low deposition speed. Additionally, further problems arise in that adhesion and texture quality are less than desirable, thereby resulting in a major cost disadvantage as compared to the electroplating process.

When a metallic thin film is deposited by the MOCVD process, chemical additives such as catalysts can be added to increase deposition speed and enhance basic characteristics of the metallic thin film. However, a problem arises in that no CVD equipment cluster is provided in which an in-situ process is carried out after the use of a barrier deposition and a catalyst enabling plasma treatment.

SUMMARY OF THE INVENTION

The present invention overcomes the shortcomings associated with the background art and achieves other advantages not realized by the background art. Accordingly, the present invention is directed to Cu film deposition equipment for a semiconductor device that substantially obviates one or more problems due to the limitations and disadvantages of the related art.

An object of the present invention is to provide Cu film deposition equipment for a semiconductor device that enables CE and plasma treatment and at the same time removes residue produced from the surface after the deposition of a Cu thin film through plasma treatment, thereby increasing Cu thin film deposition speed and lowering the production cost.

These and other objects are accomplished by Cu film deposition equipment for a semiconductor device comprising a load lock carrying out intermediate steps before and after a plurality of wafer processes; an aligner carrying out an alignment process, the alignment process ensuring a wafer reaches a desired position; a de-gas chamber removing residue produced on a surface of the wafer for the wafer processes; a feeding chamber provided with a robot, the feeding chamber positioning the wafer in and out of chamber for the wafer processes; a pre-cleaning chamber cleaning an inside and an outside of a pattern using plasma on the wafer fed by the feeding chamber; a barrier metal deposition chamber depositing a barrier metal on the pre-cleaned wafer; an adhesion glue layer (AGL) flash Cu deposition chamber depositing flash Cu on the barrier metal to enhance adhesion of the Cu thin film before depositing the film; a CECVD deposition chamber equally processing CE (Chemical Enhancer) and depositing a CVD Cu thin film on the wafer where flash Cu is deposited; and a plasma treatment chamber carrying out a plasma treatment on the wafer to form an equal super-filling after CE and another plasma treatment to remove iodine (I) produced on the surface of Cu thin film after the deposition of the CVD Cu thin film.

These and other objects are further accomplished by Cu film deposition equipment for a semiconductor device comprising a load lock carrying out intermediate steps before and after a plurality of wafer processes; an aligner carrying out an alignment process, the alignment process ensuring a wafer reaches a desired position; a de-gas and in-situ annealing chamber removing residue such as gas produced on a surface of the wafer, processing in-situ annealing to enhance adhesion of a Cu thin film deposited thereon, and controlling a texture of the Cu thin film; a feeding chamber provided with a robot, the feeding chamber positioning the wafer in and out of chambers for the wafer processes; a pre-cleaning chamber cleaning an inside and an outside of a pattern using plasma on the wafer fed by the feeding chamber; a barrier metal deposition chamber depositing a barrier metal on the pre-cleaned wafer; a CE treatment chamber processing an equal Chemical Enhancer (CE) adsorption before depositing a Cu thin film on the barrier metal; a CVD Cu deposition chamber depositing the Cu thin film on an entire surface of the wafer treated with CE; and a plasma treatment chamber carrying out a plasma treatment on the wafer, the plasma treatment forming an equal super-filling after the CE treatment and removing iodine (I) produced on the surface of Cu thin film after the deposition of the CVD Cu thin film.

These and other objects are further accomplished by Cu film deposition equipment for a semiconductor device comprising a load lock carrying out intermediate steps before and after a plurality of wafer processes; an aligner carrying out an alignment process, the alignment process ensuring a wafer reaches a desired position; a de-gas chamber removing residue produced on a surface of the wafer; a first feeding chamber provided with a robot, the feeding chamber positioning the wafer in and out of chambers for the wafer processes; a pre-cleaning chamber cleaning an inside and an outside of a pattern using plasma on the wafer fed by the first feeding chamber; a barrier metal deposition chamber depositing a barrier metal on the pre-cleaned wafer; a PVD Cu deposition chamber depositing flash Cu on the barrier metal to enhance adhesion of a CVD Cu; a second feeding chamber feeding the wafer deposited with flash Cu; a third feeding chamber positioning the wafer fed by the second feeding chamber in and out of chambers of the wafer processes; a CE treatment chamber processing an equal Chemical Enhancer (CE) treatment on an entire surface of the wafer positioned by the third feeding chamber; a plasma treatment chamber processing a plasma treatment on an entire surface of the wafer treated with CE to form an equal super-filling; a CECVD Cu deposition chamber depositing a Cu thin film on the entire surface of the wafer processed by particle filling; and an in-situ annealing chamber enhancing adhesion and controlling texture of the Cu thin film.

These and other objects are further accomplished by Cu film deposition equipment for a semiconductor device comprising a load lock carrying out intermediate steps before and after a plurality of wafer processes; an aligner carrying out an alignment process, the alignment process ensuring a wafer reaches a desired position; a de-gas chamber removing residue produced on a surface of the wafer; a first feeding chamber provided with a robot, the feeding chamber positioning the wafer in and out of chambers for the wafer processes; a pre-cleaning chamber cleaning an inside and an outside of a pattern using plasma on the wafer fed by the first feeding chamber; a barrier metal deposition chamber depositing a barrier metal on the pre-cleaned wafer; a PVD Cu deposition chamber depositing flash Cu on the barrier metal to enhance adhesion of a CVD Cu; a second feeding chamber feeding the wafer deposited with flash Cu; a third feeding chamber positioning the wafer fed by the second feeding chamber in and out of chambers of the wafer processes; a first CECVD Cu deposition chamber processing a first particle filling step on an entire surface of the wafer positioned by the third feeding chamber; a plasma treatment chamber processing a plasma treatment on the entire surface of the wafer processed by the first particle filling step; a second CECVD Cu deposition chamber processing a second particle filling step on the entire surface of the wafer treated with plasma; a CVD Cu deposition chamber depositing a Cu thin film on the entire surface of the wafer processed by the first and second particle filling steps; and an in-situ annealing chamber enhancing adhesion and controlling texture of the Cu thin film.

These and other objects are further accomplished by Cu film deposition equipment for a semiconductor device comprising a load lock carrying out intermediate steps before and after a plurality of wafer processes; an aligner carrying out an alignment process, the alignment process ensuring a wafer reaches a desired position; a de-gas chamber removing residue produced on a surface of the wafer; a first feeding chamber provided with a robot, the feeding chamber positioning the wafer in and out of chambers for the wafer processes; a pre-cleaning chamber cleaning an inside and an outside of a pattern using plasma on the wafer fed by the first feeding chamber; a barrier metal deposition chamber depositing a barrier metal on the pre-cleaned wafer; a first plasma treatment chamber processing a plasma treatment on an entire surface of the wafer where barrier metal is formed; a second feeding chamber feeding the wafer treated with plasma; a third feeding chamber positioning the wafer fed by the second feeding chamber in and out of chambers for the wafer processes; a CE treatment chamber processing an equal Chemical Enhancer (CE) treatment on the entire surface of the wafer put in by the third feeding chamber; a second plasma treatment chamber processing a plasma treatment on the entire surface of the wafer treated with CE to form an equal super-filling; a CECVD Cu deposition chamber depositing a Cu thin film on the entire surface of the wafer processed by particle filling; and an in-situ annealing chamber enhancing adhesion and controlling texture of the Cu thin film.

These and other objects are further accomplished by Cu film deposition equipment for a semiconductor device comprising a load lock carrying out intermediate steps before and after a plurality of wafer processes; an aligner carrying out an alignment process, the alignment process ensuring a wafer reaches a desired position; a de-gas chamber removing residue produced on a surface of the wafer; a first feeding chamber provided with a robot, the feeding chamber positioning the wafer in and out of chambers for the wafer processes; a pre-cleaning chamber cleaning an inside and an outside of a pattern using plasma on the wafer fed by the first feeding chamber; a barrier metal deposition chamber depositing a barrier metal on the pre-cleaned wafer; a first plasma treatment chamber processing a plasma treatment on an entire surface of the wafer where barrier metal is formed; a second feeding chamber feeding the wafer treated with plasma; a third feeding chamber positioning the wafer fed by the second feeding chamber in and out of chambers for the wafer processes; a first CECVD Cu deposition chamber processing a first particle filling step on the entire surface of the wafer put in by the third feeding chamber; a second plasma treatment chamber processing a plasma treatment on the entire surface of the wafer processed by the first particle filling step; a second CECVD Cu deposition chamber processing a second particle filling step on the entire surface of the wafer treated with plasma; a CVD Cu deposition chamber depositing a Cu thin film on the entire surface of the wafer processed by the first and second particle filling steps; and an in-situ annealing chamber enhancing adhesion and controlling texture of the Cu thin film.

These and other objects are further accomplished by a method of depositing a Cu film for a semiconductor device comprising carrying out intermediate steps before and after a plurality of wafer processes with a load lock of a Cu film deposition equipment; aligning a wafer in a desired position with an aligner of the equipment; removing residue produced on a surface of the wafer such as a gas with at least one of a de-gas chamber or a de-gas and in-situ annealing chamber of the equipment; positioning the wafer in and out of chambers for the wafer processes with a feeding chamber having a robot; cleaning an inside and an outside of a pattern using plasma on the wafer in a pre-cleaning chamber; depositing a barrier metal on the pre-cleaned wafer in a barrier metal deposition chamber; preparing the barrier metal prior to depositing a Cu thin film thereon with a first preparation process, wherein the preparation of the barrier metal includes either an adhesion glue layer (AGL) flash Cu deposition chamber depositing flash Cu on the barrier metal to enhance adhesion of the Cu thin film before depositing the Cu thin film or a CE treatment chamber processing an equal Chemical Enhancer (CE) adsorption before depositing the Cu thin film on the barrier metal; preparing the wafer after the first preparation process with a second preparation process, the second preparation process including either a CECVD deposition chamber equally processing CE (Chemical Enhancer) and depositing a CVD Cu thin film on the wafer where flash Cu is deposited or a CVD Cu deposition chamber depositing the Cu thin film on an entire surface of the wafer treated with CE; and treating the wafer in a plasma treatment chamber, the treatment including carrying out a plasma treatment on the wafer to form an equal super-filling and another plasma treatment to remove iodine (I) produced on the surface of Cu thin film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

The present invention will hereinafter be described with reference to the accompanying drawings.

First Embodiment

Figure 1:
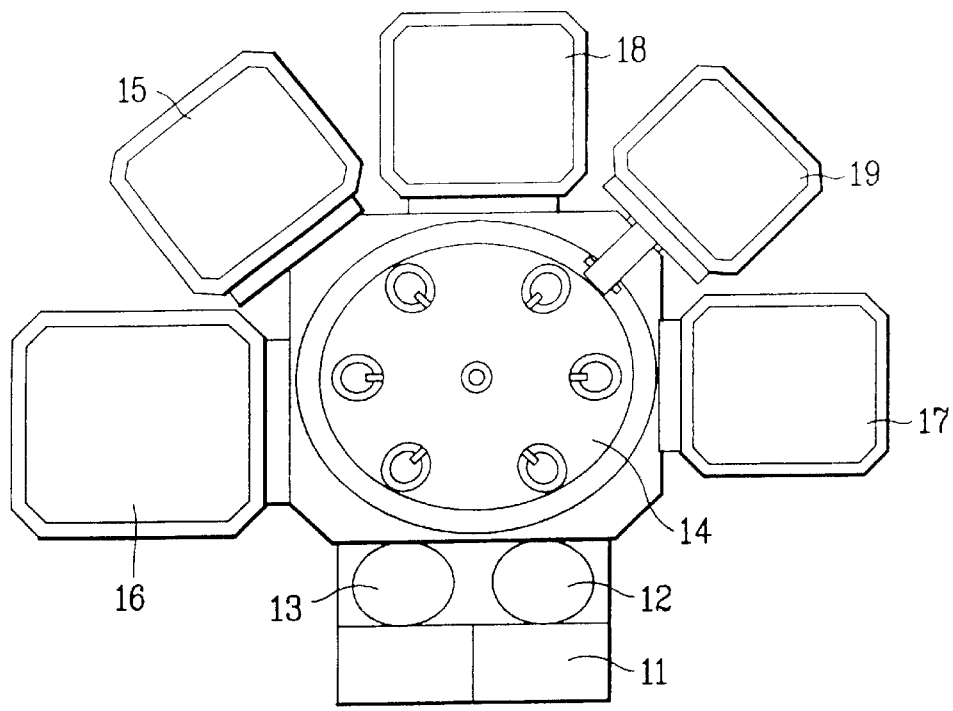
FIG. 1 is a plan view of a Cu film deposition equipment structure according to a first embodiment of the present invention.

FIG. 1 is a plan view of a Cu film deposition equipment structure according to a first embodiment of the present invention. As shown in FIG. 1, the Cu film deposition equipment of the present invention includes a load lock 11 carrying out the steps before and after wafer (not shown) processes, an aligner 12 carrying out alignment so that the wafer reaches a desired position, and a de-gas chamber 13 removing residue such as gas produced on a surface of the wafer. A feeding chamber 14 provided with a robot moves the wafer in/out of each chamber.

The Cu film deposition equipment also includes a pre-cleaning chamber 15 cleaning the inside and the outside of a pattern using plasma on the wafer fed by the feeding chamber 14, a barrier metal deposition chamber 16 depositing barrier metal on the pre-cleaned wafer, an adhesion glue layer (AGL) flash Cu deposition chamber 17 depositing flash Cu as an AGL on the barrier metal to enhance adhesion of the Cu thin film before depositing the film, a CECVD Cu deposition chamber 18 equally processing CE and depositing a CVD Cu thin film on the wafer on which flash Cu is deposited, and a plasma treatment chamber 19 carrying out a plasma treatment on the wafer to form an equal super-filling after CE treatment and another plasma treatment to remove iodine (I) produced on the surface of the Cu thin film after the deposition of the CVD Cu thin film.

The operation of the Cu film deposition equipment of a semiconductor device according to the first embodiment of the present invention will now be described hereinafter. First, a wafer enters a chamber through the load lock 11, and the aligner 12 aligns the wafer to a desired position. Then, residue produced on the surface of the wafer is removed from the de-gas chamber 13. Subsequently, the wafer is fed into the pre-cleaning chamber 15 through the feeding chamber 14 and the pre-cleaning process is carried out on the entire surface of the wafer by a dual frequency etch (DFE) process using Ar or He, or by a reactive cleaning process using a gas such as halogen.

Then, the pre-cleaned wafer is fed into the barrier metal deposition chamber 16 through the feeding chamber 14, and barrier metal is deposited on the entire surface of the wafer using a PVD process, an ionized PVD process, a CVD process, or an atomic layer deposition (ALD) process. In this case, Ta, TaN, WNx, TiN, TiAlN, TaSiN, or TiSiN is used as the barrier metal. The wafer deposited with the barrier metal is then fed to the AGL flash Cu deposition chamber 17 by the feeding chamber 14. Then, flash Cu is deposited to enhance adhesion of the Cu thin film.

Subsequently, the wafer deposited with the flash Cu is fed to the CECVD Cu deposition chamber 18 to carry out an equal CE treatment on the entire surface of the wafer. Then, the wafer processed with CE is fed to the plasma treatment chamber 19 whereby plasma is treated on the entire surface of the wafer to form an equal super-filling. Afterwards, the wafer treated with plasma is again fed to the CECVD Cu deposition chamber 18 whereby the Cu thin film is deposited on the entire surface of the wafer. Then, the wafer deposited with the Cu thin film is again fed to the plasma treatment chamber 19 whereby plasma is treated on the entire surface of the wafer to remove residue such as iodine (I) and CE remaining on the surface of the Cu thin film.

In this case, the AGL flash Cu deposition chamber 17 can deposit a Cu thin film at a thickness of 10 to 500 Å and has a power of 1 to 500 kW, in which deposition can be carried out by using long throw, PVD, or ionized PVD processes. Meanwhile, in the CECVD Cu deposition chamber 18, deposition can be carried out at a temperature ranging from 50 to 300° C.

Second Embodiment

Figure 2:
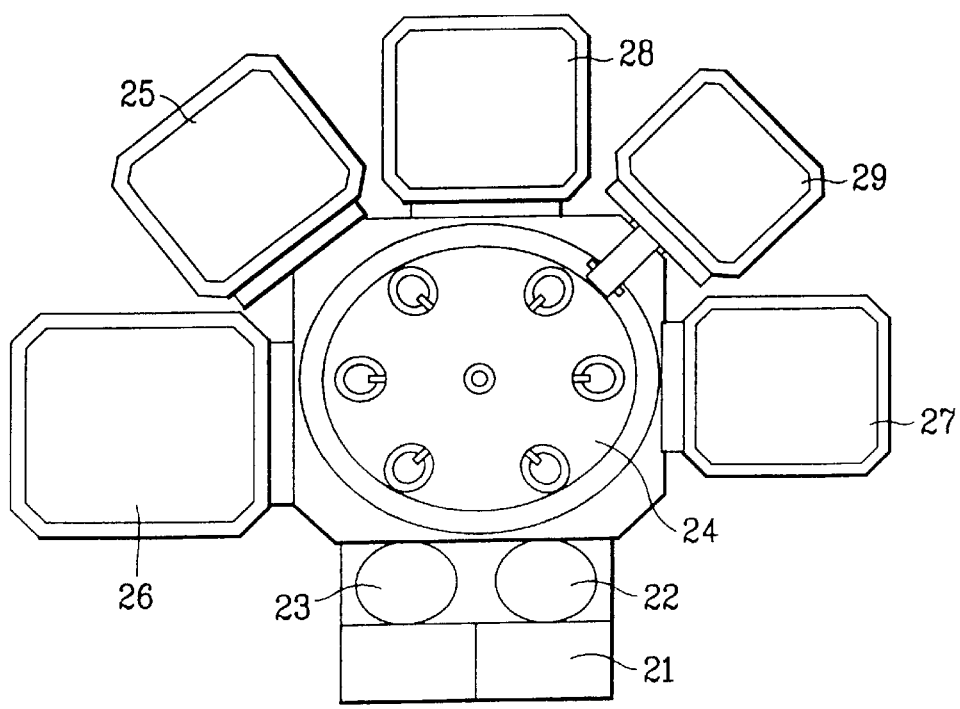
FIG. 2 is a plan view of a Cu film deposition equipment structure according to a second embodiment of the present invention.

FIG. 2 is a plan view of a Cu film deposition equipment structure according to a second embodiment of the present invention. As shown in FIG. 2, the Cu film deposition equipment of the present invention includes a load lock 21 carrying out the steps before and after wafer (not shown) processes, an aligner 22 carrying out alignment so that the wafer reaches a desired position, and a de-gas and in-situ annealing chamber 23 removing residue such as gas produced on a surface of the wafer and processing in-situ annealing to enhance adhesion of a Cu thin film deposited and to control a texture of the Cu thin film. A feeding chamber 24 provided with a robot places the wafer in/out of each chamber.

The Cu film deposition equipment also includes a pre-cleaning chamber 25 cleaning the inside and the outside of a pattern using plasma on the wafer fed by the feeding chamber 24, a barrier metal deposition chamber 26 depositing barrier metal on the pre-cleaned wafer by PVD, CVD, or ALD processes, an AGL flash Cu deposition chamber 27 depositing flash Cu as an AGL on the barrier metal before depositing the Cu thin film to enhance adhesion of the Cu thin film, a CECVD Cu deposition chamber 28 equally processing CE treatment and depositing a CVD Cu thin film on the wafer on which flash Cu is deposited, and a plasma treatment chamber 29 carrying out plasma treatment on the wafer to form an equal super-filling after the CE treatment and another plasma to remove iodine (I) produced on the surface of the Cu thin film after the deposition of the CVD Cu thin film.

The operation of the Cu film deposition equipment of a semiconductor device according to the second embodiment of the present invention will now be described hereinafter. First, a wafer enters a chamber through the load lock 21, and an aligner 22 aligns the wafer to a desired position. Then, residue produced on a surface of the wafer is removed from a de-gas and in-situ annealing chamber 23.

Subsequently, the wafer is fed into the pre-cleaning chamber through the feeding chamber 24 and the pre-cleaning process is carried out on an entire surface of the wafer by a dual frequency etch (DFE) process using Ar or He, or by a reactive cleaning process using a gas such as halogen. Then, the pre-cleaned wafer is fed into the barrier metal deposition chamber 26 through the feeding chamber 24 and, barrier metal is deposited on the entire surface of the wafer using a PVD process, an ionized PVD process, a CVD process, or an atomic layer deposition (ALD) process. In this case, Ta, TaN, WNx, TiN, TiAlN, TaSiN, or TiSiN is used as the barrier metal.

The wafer deposited with the barrier metal is then fed to the AGL flash Cu deposition chamber 27 by the feeding chamber 24. Then, flash Cu is deposited to enhance adhesion of the Cu thin film. Subsequently, the wafer deposited with the flash Cu is fed to the CECVD Cu deposition chamber 28 to carry out an equal CE treatment on the entire surface of the wafer. Then, the wafer processed with CE is fed to the plasma treatment chamber 19 whereby plasma is treated on the entire surface of the wafer to form an equal super-filling.

Afterwards, the wafer treated with plasma is fed to the de-gas and in-situ annealing chamber 23 whereby an in-situ annealing process is carried out to enhance adhesion and to control texture of the thin film deposited at the CECVD Cu deposition chamber 28. In this case, the AGL flash Cu chamber 27 can deposit a Cu thin film at a thickness of 10 to 500 Å and has a power of 1 to 500 kW, in which deposition can be carried out by a long throw, PVD, or ionized PVD process. Meanwhile, in the CECVD Cu deposition chamber 28 deposition can be carried out at a temperature ranging from 50 to 300° C.

Third Embodiment

Figure 3:
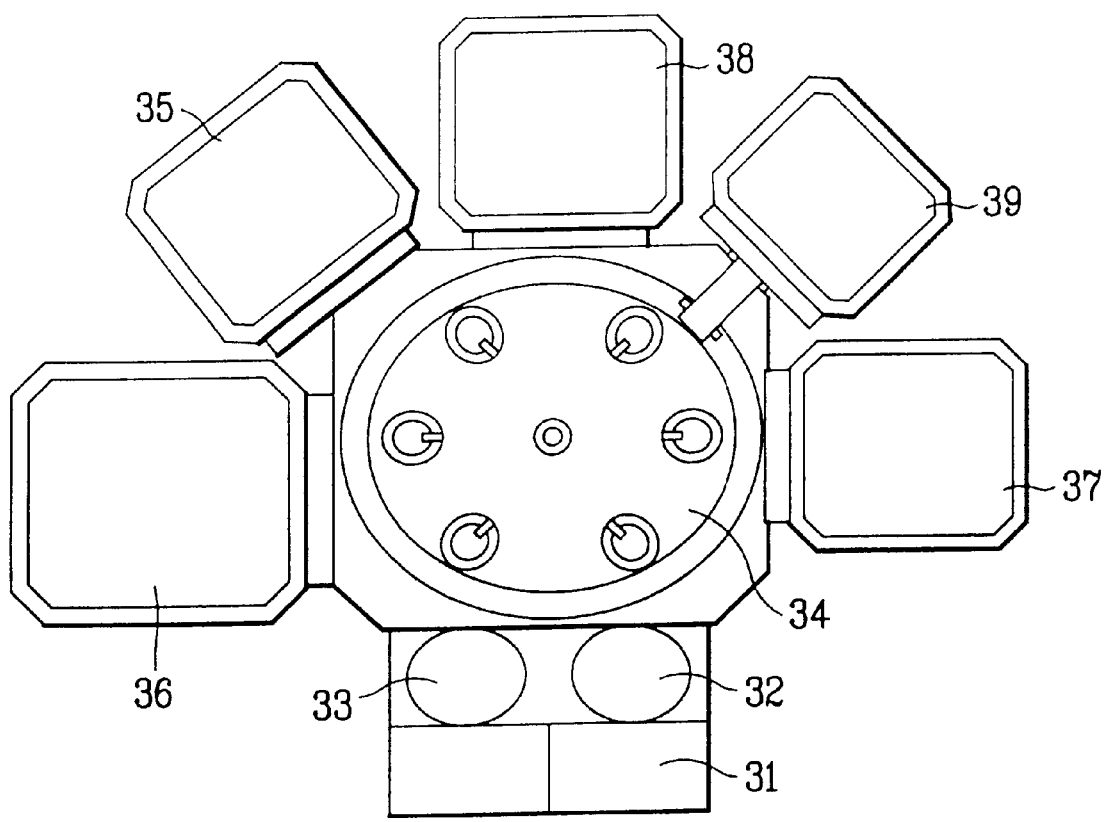
FIG. 3 is a plan view of a Cu film deposition equipment structure according to a third embodiment of the present invention.

FIG. 3 is a plan view of a Cu film deposition equipment structure according to a third embodiment of the present invention. As shown in FIG. 3, the Cu film deposition equipment of the present invention includes a load lock 31 carrying out the steps before and after wafer (not shown) processes, an aligner 32 carrying out alignment so that the wafer reaches a desired position, and a de-gas and in-situ annealing chamber 33 removing residue such as gas produced on a surface of the wafer and processing in-situ annealing to enhance adhesion and to control texture. A feeding chamber 34 provided with a robot places the wafer in/out of each chamber.

The Cu film deposition equipment also includes a pre-cleaning chamber 35 cleaning the inside and the outside of a pattern using plasma on the wafer fed by the feeding chamber 34, a barrier metal deposition chamber 36 depositing barrier metal on the pre-cleaned wafer by PVD, CVD, or ALD process, a CE treatment chamber 37 processing an equal CE adsorption before depositing a Cu thin film on the barrier metal, a CVD Cu deposition chamber 38 depositing the Cu thin film on an entire surface of the wafer treated with CE, a CECVD Cu deposition chamber 38 equally processing CE treatment and depositing a CVD Cu thin film on the wafer on which flash Cu is deposited, and a plasma treatment chamber 39 carrying out plasma treatment on the wafer to form an equal super-filling after the CE treatment and another plasma to remove iodine (I) produced on the surface of the Cu thin film after the deposition of the CVD Cu thin film.

The operation of the Cu film deposition equipment of a semiconductor device according to the third embodiment of the present invention will now be described hereinafter. First, a wafer enters a chamber through a load lock 31, and an aligner 32 aligns the wafer to a desired position. Then, residue produced on a surface of the wafer is removed from a de-gas and in-situ annealing chamber 33.

Subsequently, the wafer is fed into a pre-cleaning chamber 35 through a feeding chamber 34, and the pre-cleaning process is carried out on an entire surface of the wafer by a dual frequency etch (DFE) process using Ar or He, or by a reactive cleaning process using a gas such as halogen. Then, the pre-cleaned wafer is fed into a barrier metal deposition chamber 36 through the feeding chamber 34, and barrier metal is deposited on the entire surface of the wafer using a PVD process, an ionized PVD process, a CVD process, or an atomic layer deposition (ALD) process. In this case, Ta, TaN, WNx, TiN, TiAlN, TaSiN, or TiSiN is used as the barrier metal.

The wafer deposited with the barrier metal is then fed to a CE treatment chamber 37 through the feeding chamber 34 whereby an equal CE is adsorbed on the entire surface of the wafer. Then, the wafer adsorbed with CE is fed to a plasma treatment chamber 39 whereby plasma treatment is processed to form an equal super-filling after the CE adsorption. Afterwards, the wafer treated with plasma is fed to a CVD Cu deposition chamber 38 whereby Cu thin film is deposited on the entire surface of the wafer. Then, the wafer with the Cu thin film deposition is again fed to the plasma treatment chamber 39 to remove, through a plasma treatment, residue such as iodine (I) produced on the surface of the Cu thin film after the deposition of the Cu thin film.

Fourth Embodiment

Figure 4:
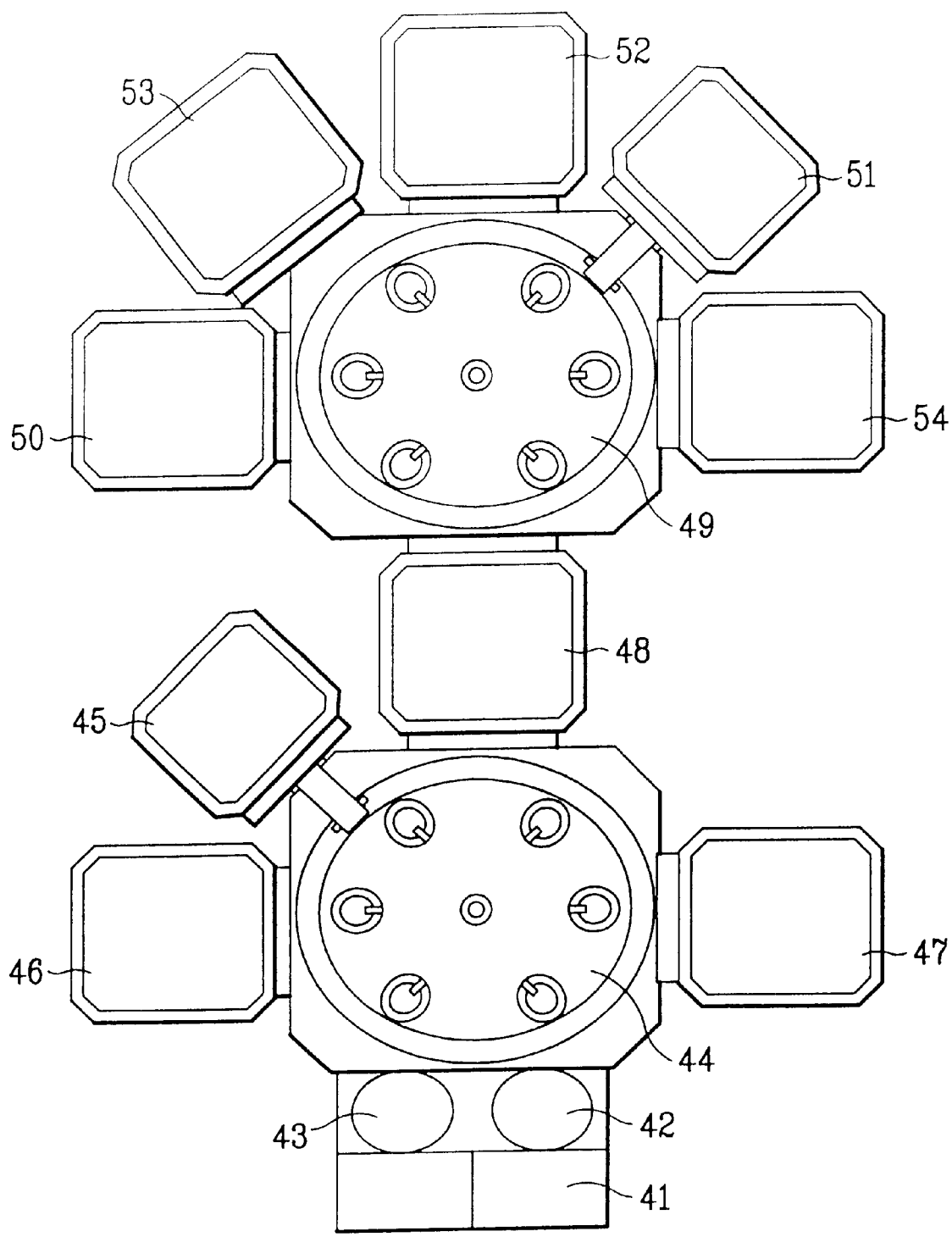
FIG. 4 is a plan view of a Cu film deposition equipment structure according to a fourth embodiment of the present invention.

FIG. 4 is a plan view of a Cu film deposition equipment structure according to a fourth embodiment of the present invention. As shown in FIG. 4, the Cu film deposition equipment of the present invention includes a load lock 41 carrying out the steps before and after wafer (not shown) processes, an aligner 42 carrying out alignment so that the wafer reaches a desired position, and a de-gas chamber 43 removing residue such as gas produced on a surface of the wafer. A first feeding chamber 44 provided with a robot places the wafer in/out of each chamber.

The Cu film deposition equipment also includes a pre-cleaning chamber 45 cleaning the inside and the outside of a pattern using plasma on the wafer fed by the first feeding chamber 44, a barrier metal deposition chamber 46 depositing barrier metal on the pre-cleaned wafer by PVD, CVD, or ALD process, a PVD Cu deposition chamber 47 depositing flash Cu as an AGL on the barrier metal to enhance adhesion of CVD Cu, a second feeding chamber 48 feeding the wafer deposited with flash Cu, and a third feeding chamber 49 positioning the wafer fed by the second feeding chamber 48 in/out of each chamber.

A CE treatment chamber 50 processing an equal CE treatment on an entire surface of the wafer put in by the third feeding chamber 49, a plasma treatment chamber 51 processing a plasma treatment on the entire surface of the wafer treated with CE to form an equal super-filling, a CECVD Cu deposition chamber 53 depositing Cu thin film on the entire surface of the wafer processed by particle filling, and an in-situ annealing chamber 54 to enhance adhesion and to control texture of the Cu thin film are also provided in the equipment of this embodiment. In this case, the plasma treatment chamber 51 removes CE such as iodine (I), which is produced on the surface of the Cu thin film, after the Cu thin film is deposited at the CECVD Cu deposition chamber 52.

The operation of the Cu film deposition equipment of a semiconductor device according to the fourth embodiment of the present invention will now be described hereinafter. First, a wafer enters a chamber through a load lock 41, and an aligner 42 aligns the wafer to a desired position. Then, residue produced on a surface of the wafer is removed from a de-gas chamber 43.

Subsequently, the wafer is fed into a pre-cleaning chamber 45 through a first feeding chamber 44, and a pre-cleaning process is carried out on an entire surface of the wafer by a dual frequency etch (DFE) process using Ar or He, or by reactive cleaning process using gas such as halogen. Then, the pre-cleaned wafer is fed into a barrier metal deposition chamber 46 through the first feeding chamber 44, and barrier metal is deposited on the entire surface of the wafer using a PVD process, an ionized PVD process, a CVD process, or an atomic layer deposition (ALD) process. In this case, Ta, TaN, WNx, TiN, TiAlN, TaSiN, or TiSiN is used as the barrier metal.

Afterwards, the wafer deposited with barrier metal is fed to a PVD Cu deposition chamber 47, through a first feeding chamber 44, where flash Cu is deposited as an AGL to enhance adhesion of the Cu thin film which will later be deposited at the CVD Cu deposition chamber 53. Then, the wafer deposited with flash Cu is fed to the CE treatment chamber 50 through the first feeding chamber 44, the second feeding chamber 48, and the third feeding chamber 49 to process equal CE treatment on the entire surface of the wafer. The wafer with CE treatment is then fed to the plasma treatment chamber 51 through the third feeding chamber 49 to process plasma treatment on the entire surface of the wafer to form an equal super-filling of a Cu thin film, which will be deposited later on.

In addition, the wafer treated with plasma is again fed to the CECVD Cu deposition chamber 53, through the third feeding chamber 49, where a particle filling step is processed. Then, the wafer is fed to the CVD Cu deposition chamber 53 whereby a Cu thin film is deposited on the entire surface of the wafer. Then, the wafer deposited with Cu thin film is fed to the in-situ annealing chamber 54, through the third feeding chamber 49, whereby an in-situ annealing process is carried out to enhance adhesion and to control texture of the Cu thin film.

Meanwhile, the PVD Cu deposition chamber 47 can deposit a Cu thin film at a thickness of 10 to 500 Å and has a power of 1 to 500° C., in which deposition can be carried out by using the process of long throw, PVD, or iodized PVD. In the in-situ annealing chamber 54, an annealing process can be carried out under an ambient of Ar and reduced $H_2$, and also under an ambient of $H_2$+He and an ambient of $H_2$+Ar. The annealing process can also be carried out at a temperature ranging from 50 to 450° C.

Fifth Embodiment

Figure 5:
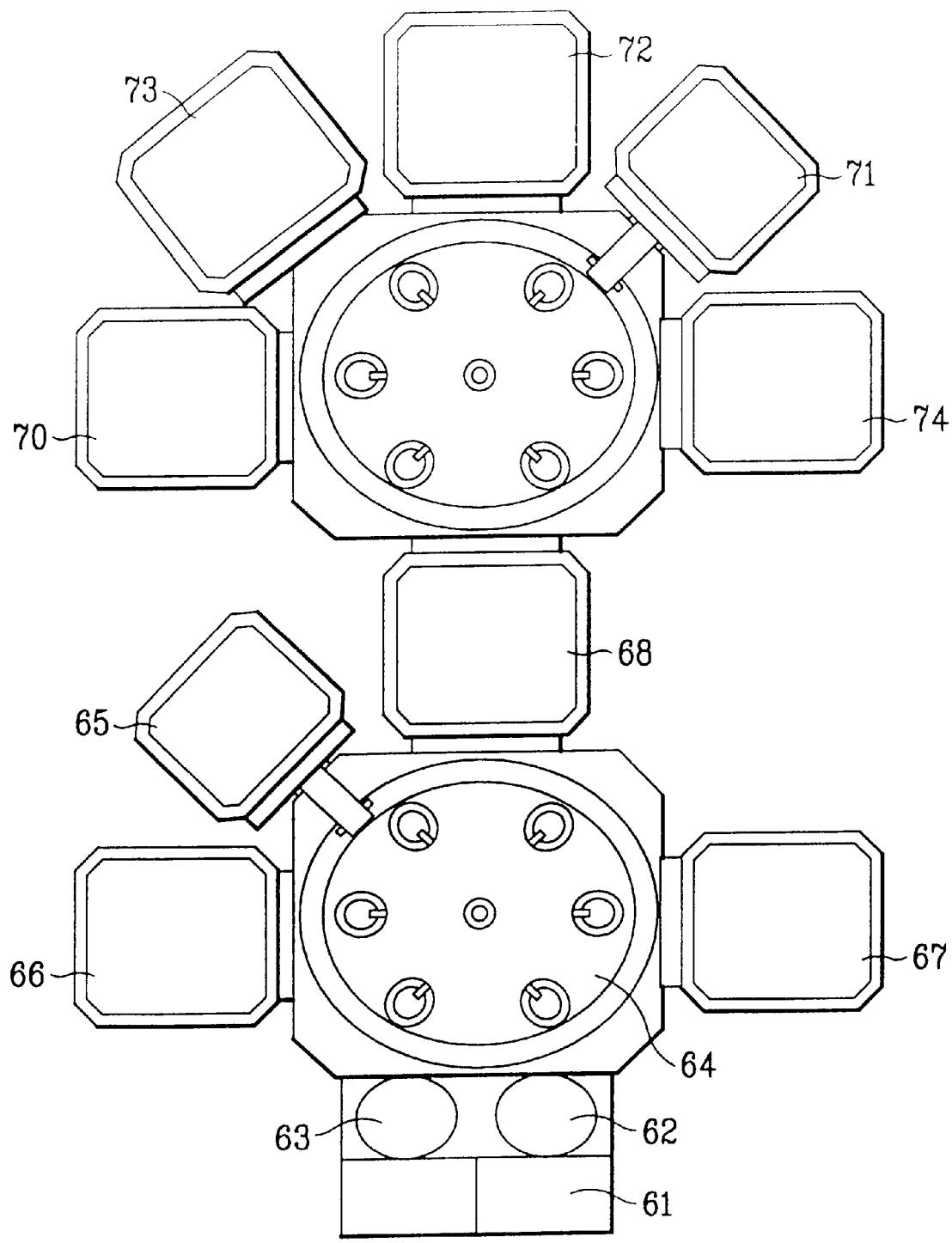
FIG. 5 is a plan view of a Cu film deposition equipment structure according to a fifth embodiment of the present invention.

FIG. 5 is a plan view of a Cu film deposition equipment structure according to a fifth embodiment of the present invention. As shown in FIG. 5, the fifth embodiment of the present invention includes a CECVD Cu deposition chamber instead of a CE treatment chamber. The CECVD Cu deposition chamber processes CE treatment and CVD Cu thin film deposition at the same time, thereby improving throughput and minimizing contamination of the chamber.

The Cu film deposition equipment of the present invention includes a load lock 61 carrying out the steps before and after wafer (not shown) processes, an aligner 62 carrying out alignment so that the wafer reaches a desired position, and a de-gas chamber 63 removing residue such as gas produced on a surface of the wafer. A first feeding chamber 64 provided with a robot places the wafer in/out of each chamber.

The Cu film deposition equipment also includes a pre-cleaning chamber 65 cleaning the inside and the outside of a pattern using plasma on the wafer fed by the first feeding chamber 64, a barrier metal deposition chamber 66 depositing barrier metal on the pre-cleaned wafer by PVD, CVD, or ALD process, a PVD Cu deposition chamber 67 depositing flash Cu as an AGL on the barrier metal to enhance adhesion of CVD Cu, a second feeding chamber 68 feeding the wafer deposited with flash Cu, and a third feeding chamber 69 positioning the wafer fed by the second feeding chamber 68 in/out of each chamber.

A first CECVD Cu deposition chamber 70 processing a first particle filling step on an entire surface of the wafer put in by the third feeding chamber 69, a plasma treatment chamber 71 processing a plasma treatment on the entire surface of the wafer processed by the first particle filling step, a second CECVD Cu deposition chamber 72 processing a second particle filling step on the entire surface of the wafer treated with plasma, a CVD Cu deposition chamber 73 depositing Cu thin film on the entire surface of the wafer processed by the first and second particle filling steps, and an in-situ annealing chamber 74 enhancing adhesion and controlling texture of the Cu thin film are also provided in the equipment of this embodiment. In this case, the plasma treatment chamber 71 removes CE such as iodine (I) produced on the surface after the Cu thin film is deposited at the first and second CECVD Cu deposition chambers 70 and 72.

Sixth Embodiment

Figure 6:
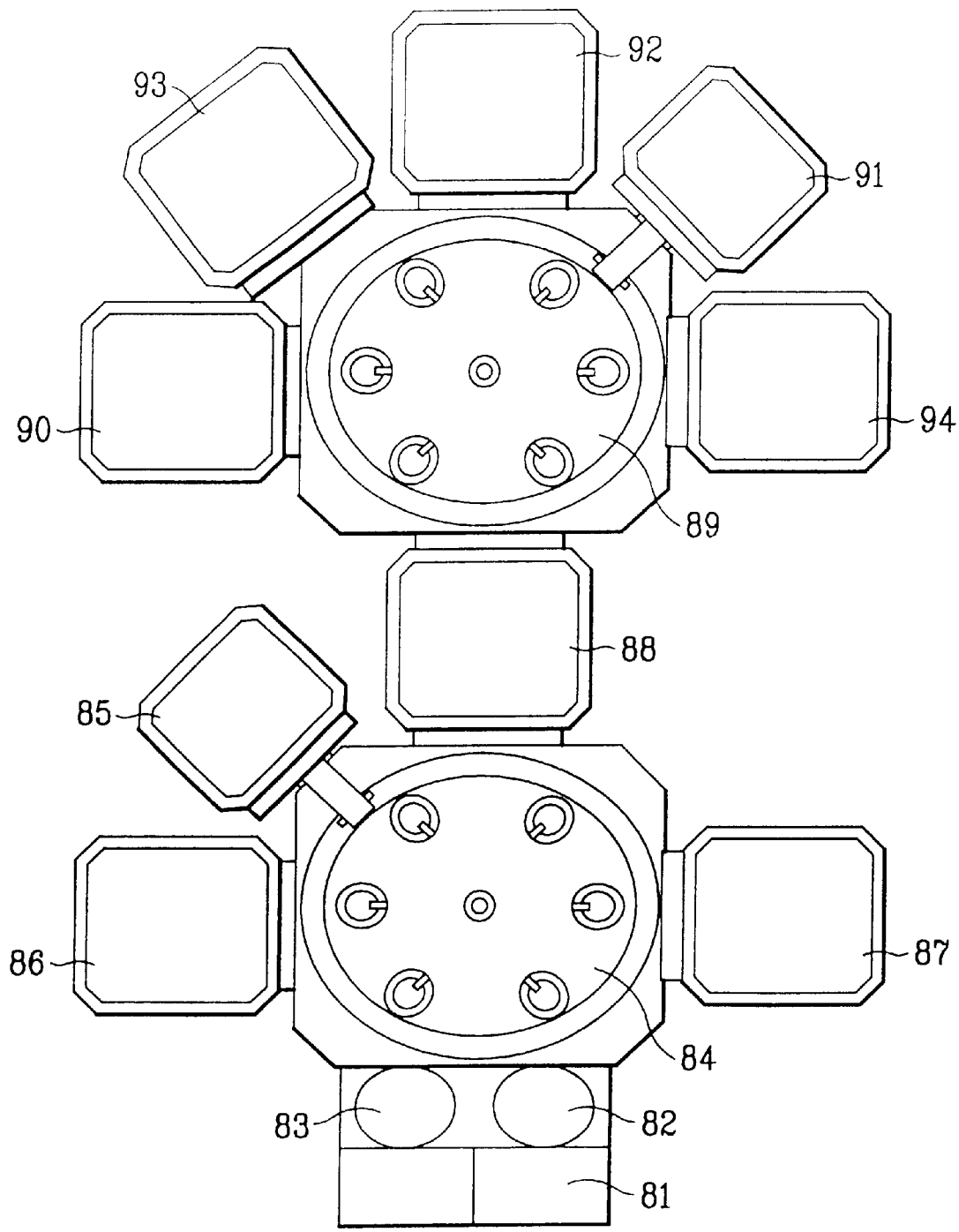
FIG. 6 is a plan view of a Cu film deposition equipment structure according to a sixth embodiment of the present invention.

FIG. 6 is a plan view of a Cu film deposition equipment structure according to a sixth embodiment of the present invention. As shown in FIG. 6, the sixth embodiment of the present invention includes another plasma treatment chamber instead of the PVD Cu deposition chamber of the fourth embodiment of the present invention.

The Cu film deposition equipment of the present invention includes a load lock 81 carrying out the steps before and after wafer (not shown) processes, an aligner 82 carrying out alignment so that the wafer reaches a desired position, and a de-gas chamber 83 removing residue such as gas produced on a surface of the wafer. A first feeding chamber 84 provided with a robot places the wafer in/out of each chamber.

The Cu film deposition equipment also includes a pre-cleaning chamber 85 cleaning the inside and the outside of a pattern using plasma on the wafer fed by the first feeding chamber 84, a barrier metal deposition chamber 86 depositing barrier metal on the pre-cleaned wafer by PVD, CVD, or ALD process, a first plasma treatment chamber 87 processing plasma treatment on the entire surface of the wafer whereby barrier metal is formed, a second feeding chamber 88 feeding the wafer treated with plasma, and a third feeding chamber 89 positioning the wafer fed by the second feeding chamber 88 in/out of each chamber.

A CE treatment chamber 90 processing an equal CE treatment on an entire surface of the wafer put in by the third feeding chamber 89, a second plasma treatment chamber 91 processing a plasma treatment on the entire surface of the wafer treated with CE to form an equal super-filling, a CECVD Cu deposition chamber 93 depositing Cu thin film on the entire surface of the wafer processed by particle filling, and an in-situ annealing chamber 94 to enhance adhesion and to control texture of the Cu thin film are also provided with the equipment of this embodiment. In this case, the second plasma treatment chamber 91 removes CE such as iodine (I) produced on the surface of the Cu thin film after the Cu thin film is deposited at the CECVD Cu deposition chamber 92.

Seventh Embodiment

Figure 7:
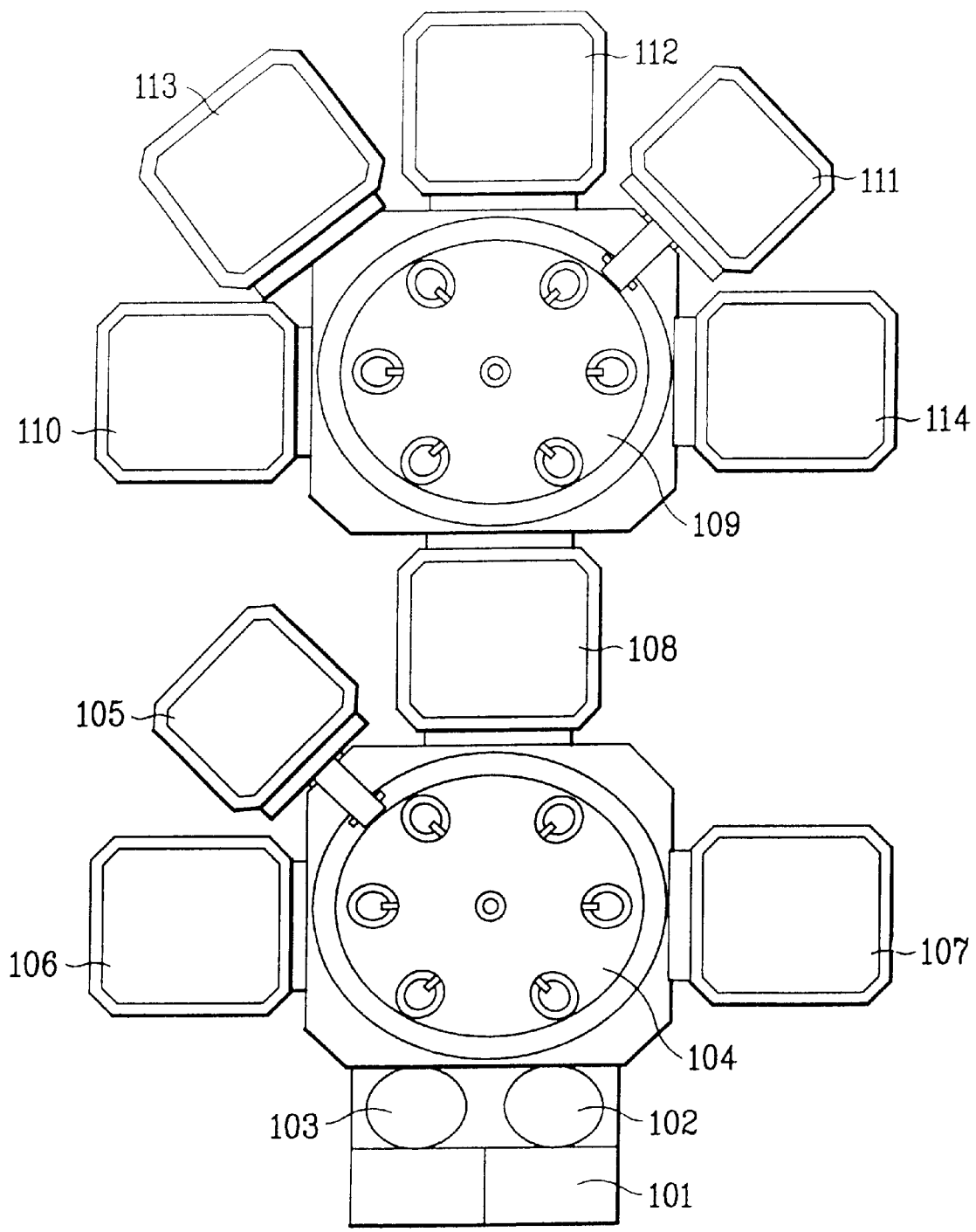
FIG. 7 is a plan view of a Cu film deposition equipment structure according to a seventh embodiment of the present invention.

FIG. 7 is a plan view of a Cu film deposition equipment structure according to a seventh embodiment of the present invention. As shown in FIG. 7, the seventh embodiment of the present invention includes another plasma treatment chamber instead of the PVD Cu deposition chamber of the fifth embodiment of the present invention.

The Cu film deposition equipment of the present invention includes a load lock 101 carrying out the steps before and after wafer (not shown) processes, an aligner 102 carrying out alignment so that the wafer reaches a desired position, and a de-gas chamber 103 removing residue such as gas produced on a surface of the wafer. A first feeding chamber 104 provided with a robot places the wafer in/out of each chamber.

The Cu film deposition equipment also includes a pre-cleaning chamber 105 cleaning the inside and the outside of a pattern using plasma on the wafer fed by the first feeding chamber 104, a barrier metal deposition chamber 106 depositing barrier metal on the pre-cleaned wafer by PVD, CVD, or ALD process, a first plasma treatment chamber 107 processing plasma treatment on the entire surface of the wafer deposited with barrier metal, a second feeding chamber 108 feeding the wafer treated with plasma, and a third feeding chamber 109 positioning the wafer fed by the second feeding chamber 108 in/out of each chamber.

A first CECVD Cu deposition chamber 110 processing a first particle filling step on an entire surface of the wafer input by the third feeding chamber 109, a second plasma treatment chamber 111 processing a plasma treatment on the entire surface of the wafer processed by the first particle filling step, a second CECVD Cu deposition chamber 112 processing a second particle filling step on the entire surface of the wafer treated with plasma, a CVD Cu deposition chamber 113 depositing Cu thin film on the entire surface of the wafer processed by the first and second particle filling steps, and an in-situ annealing chamber 114 enhancing adhesion and controlling texture of the Cu thin film are also provided with the equipment of this embodiment. In this case, the second plasma treatment chamber removes CE such as iodine (I) produced on the surface of the Cu thin film after the Cu thin film is deposited at the first and second CECVD Cu deposition chambers 110 and 112.

The aforementioned Cu film deposition equipment of a semiconductor device according to the present invention has the following advantage. The Cu film deposition equipment of the present invention is applied, without an electroplating process, to a Cu line structure of an ultra fine semiconductor device requiring high speed by using plasma treatments of CECVD Cu, CVD Cu, and PVD Cu. This enables all Cu thin film deposition processes to be carried out in an in-situ process. In addition, the reliability of the line structure is increased by removing a vacuum braking step typically included in an electroplating process.

The invention being thus described, it will be obvious that the same may be varied in many ways. The present teachings can be readily applied to other types of equipments. Such variations are not to be regarded as a departure from the spirit and scope of the invention, and all such modifications as would be obvious to one skilled in the art are intended to be included within the scope of the following claims.

What is claimed is:

1. A Cu film deposition equipment for a semiconductor device comprising:
   a load lock carrying out intermediate steps before and after a plurality of wafer processes;
   an aligner carrying out an alignment process, said alignment process ensuring a wafer reaches a desired position;
   a de-gas chamber removing residue produced on a surface of the wafer for said wafer processes;
   a feeding chamber provided with a robot, said feeding chamber positioning the wafer in and out of chamber for said wafer processes;
   a pre-cleaning chamber cleaning an inside and an outside of a pattern using plasma on the wafer fed by the feeding chamber;
   a barrier metal deposition chamber depositing a barrier metal on the pre-cleaned wafer;
   an adhesion glue layer (AGL) flash Cu deposition chamber depositing flash Cu on the barrier metal to enhance adhesion of the Cu thin film before depositing the film;
   a CECVD deposition chamber equally processing CE (Chemical Enhancer) and depositing a CVD Cu thin film on the wafer where flash Cu is deposited; and
   a plasma treatment chamber carrying out a plasma treatment on the wafer to form an equal super-filling after CE and another plasma treatment to remove iodine (I) produced on the surface of Cu thin film after the deposition of the CVD Cu thin film.

2. The equipment according to claim 1, wherein the pre-cleaning chamber carries out a pre-cleaning process on an entire surface of the wafer by either a dual frequency etch (DFE) process using Ar or He or by a reactive cleaning process using a gas (such as halogen).

3. The equipment according to claim 1, wherein the barrier metal deposition chamber deposits a barrier metal on the pre-cleaned wafer by using a PVD process, an ionized PVD process, a CVD process, or an ALD process.

4. The equipment according to claim 1, wherein the barrier metal includes any one of Ta, TaN, WNx, TiN, TiAlN, TaSiN, or TiSiN.

5. The equipment according to claim 1, wherein the AGL flash Cu deposition chamber enables deposition of a flash Cu of a thickness ranging from 10 to 500 Å, and is a chamber of a power ranging from 1 to 500 kW.

6. The equipment according to claim 1, wherein the AGL flash Cu deposition chamber carries out a deposition process.

7. The equipment according to claim 6, wherein the deposition process is a long throw process, a PVD process or an ionized PVD process.

8. The equipment according to claim 1, wherein the CECVD Cu deposition chamber includes separate lines for a CE treatment step and a CVD deposition step.

9. The equipment according to claim 1, wherein the CECVD Cu deposition chamber can carry out a deposition process at a temperature ranging from 50 to 300° C.

10. The equipment according to claim 1, wherein the de-gas chamber includes a de-gas and in-situ annealing chamber carrying out an in-situ annealing process to remove residue produced on the surface of the wafer, enhancing adhesion of the deposited Cu thin film, and controlling a texture of the deposited Cu thin film.

11. The equipment according to claim 10, said de-gas and in-situ annealing chamber carrying out an in-situ annealing process under an ambient of Ar or an ambient of reduced hydrogen.

12. The equipment according to claim 10, said de-gas and in-situ annealing chamber carrying out an annealing process at a temperature ranging from 50 to 450° C.

13. The equipment of claim 10, said de-gas and in-situ annealing chamber carrying out an in-situ annealing process under an ambient of $H_2$+He or an ambient of $H_2$+Ar.

14. A Cu film deposition equipment for a semiconductor device comprising:
- a load lock carrying out intermediate steps before and after a plurality of wafer processes;
- an aligner carrying out an alignment process, said alignment process ensuring a wafer reaches a desired position;
- a de-gas and in-situ annealing chamber removing residue such as gas produced on a surface of the wafer, processing in-situ annealing to enhance adhesion of a Cu thin film deposited thereon, and controlling a texture of the Cu thin film;
- a feeding chamber provided with a robot, said feeding chamber positioning the wafer in and out of chambers for said wafer processes;
- a pre-cleaning chamber cleaning an inside and an outside of a pattern using plasma on the wafer fed by the feeding chamber;
- a barrier metal deposition chamber depositing a barrier metal on the pre-cleaned wafer;
- a CE treatment chamber processing an equal Chemical Enhancer (CE) adsorption before depositing a Cu thin film on the barrier metal;
- a CVD Cu deposition chamber depositing the Cu thin film on an entire surface of the wafer treated with CE; and
- a plasma treatment chamber carrying out a plasma treatment on the wafer, said plasma treatment forming an equal super-filling after the CE treatment and removing iodine (I) produced on the surface of Cu thin film after the deposition of the CVD Cu thin film.

15. A Cu film deposition equipment for a semiconductor device comprising:
- a load lock carrying out intermediate steps before and after a plurality of wafer processes;
- an aligner carrying out an alignment process, said alignment process ensuring a wafer reaches a desired position;
- a de-gas chamber removing residue produced on a surface of the wafer;
- a first feeding chamber provided with a robot, said feeding chamber positioning the wafer in and out of chambers for said wafer processes;
- a pre-cleaning chamber cleaning an inside and an outside of a pattern using plasma on the wafer fed by the first feeding chamber;
- a barrier metal deposition chamber depositing a barrier metal on the pre-cleaned wafer;
- a PVD Cu deposition chamber depositing flash Cu on the barrier metal to enhance adhesion of a CVD Cu;
- a second feeding chamber feeding the wafer deposited with flash Cu;
- a third feeding chamber positioning the wafer fed by the second feeding chamber in and out of chambers of said wafer processes;
- a CE treatment chamber processing an equal Chemical Enhancer (CE) treatment on an entire surface of the wafer positioned by the third feeding chamber;
- a plasma treatment chamber processing a plasma treatment on an entire surface of the wafer treated with CE to form an equal super-filling;
- a CECVD Cu deposition chamber depositing a Cu thin film on the entire surface of the wafer processed by particle filling; and
- an in-situ annealing chamber enhancing adhesion and controlling texture of the Cu thin film.

16. A Cu film deposition equipment for a semiconductor device comprising:
- a load lock carrying out intermediate steps before and after a plurality of wafer processes;
- an aligner carrying out an alignment process, said alignment process ensuring a wafer reaches a desired position;
- a de-gas chamber removing residue produced on a surface of the wafer;
- a first feeding chamber provided with a robot, said feeding chamber positioning the wafer in and out of chambers for said wafer processes;
- a pre-cleaning chamber cleaning an inside and an outside of a pattern using plasma on the wafer fed by the first feeding chamber;
- a barrier metal deposition chamber depositing a barrier metal on the pre-cleaned wafer;
- a PVD Cu deposition chamber depositing flash Cu on the barrier metal to enhance adhesion of a CVD Cu;
- a second feeding chamber feeding the wafer deposited with flash Cu;
- a third feeding chamber positioning the wafer fed by the second feeding chamber in and out of chambers of said wafer processes;
- a first CECVD Cu deposition chamber processing a first particle filling step on an entire surface of the wafer positioned by the third feeding chamber;
- a plasma treatment chamber processing a plasma treatment on the entire surface of the wafer processed by the first particle filling step;
- a second CECVD Cu deposition chamber processing a second particle filling step on the entire surface of the wafer treated with plasma;
- a CVD Cu deposition chamber depositing a Cu thin film on the entire surface of the wafer processed by the first and second particle filling steps; and
- an in-situ annealing chamber enhancing adhesion and controlling texture of the Cu thin film.

17. A Cu film deposition equipment for a semiconductor device comprising:
- a load lock carrying out intermediate steps before and after a plurality of wafer processes;
- an aligner carrying out an alignment process, said alignment process ensuring a wafer reaches a desired position;
- a de-gas chamber removing residue produced on a surface of the wafer;
- a first feeding chamber provided with a robot, said feeding chamber positioning the wafer in and out of chambers for said wafer processes;
- a pre-cleaning chamber cleaning an inside and an outside of a pattern using plasma on the wafer fed by the first feeding chamber;
- a barrier metal deposition chamber depositing a barrier metal on the pre-cleaned wafer;
- a first plasma treatment chamber processing a plasma treatment on an entire surface of the wafer where barrier metal is formed;

a second feeding chamber feeding the wafer treated with plasma;

a third feeding chamber positioning the wafer fed by the second feeding chamber in and out of chambers for said wafer processes;

a CE treatment chamber processing an equal Chemical Enhancer (CE) treatment on the entire surface of the wafer put in by the third feeding chamber;

a second plasma treatment chamber processing a plasma treatment on the entire surface of the wafer treated with CE to form an equal super-filling;

a CECVD Cu deposition chamber depositing a Cu thin film on the entire surface of the wafer processed by particle filling; and an in-situ annealing chamber enhancing adhesion and controlling texture of the Cu thin film.

18. A Cu film deposition equipment for a semiconductor device comprising:

a load lock carrying out intermediate steps before and after a plurality of wafer processes;

an aligner carrying out an alignment process, said alignment process ensuring a wafer reaches a desired position;

a de-gas chamber removing residue produced on a surface of the wafer;

a first feeding chamber provided with a robot, said feeding chamber positioning the wafer in and out of chambers for said wafer processes;

a pre-cleaning chamber cleaning an inside and an outside of a pattern using plasma on the wafer fed by the first feeding chamber;

a barrier metal deposition chamber depositing a barrier metal on the pre-cleaned wafer;

a first plasma treatment chamber processing a plasma treatment on an entire surface of the wafer where barrier metal is formed;

a second feeding chamber feeding the wafer treated with plasma;

a third feeding chamber positioning the wafer fed by the second feeding chamber in and out of chambers for said wafer processes;

a first CECVD Cu deposition chamber processing a first particle filling step on the entire surface of the wafer put in by the third feeding chamber;

a second plasma treatment chamber processing a plasma treatment on the entire surface of the wafer processed by the first particle filling step;

a second CECVD Cu deposition chamber processing a second particle filling step on the entire surface of the wafer treated with plasma;

a CVD Cu deposition chamber depositing a Cu thin film on the entire surface of the wafer processed by the first and second particle filling steps; and an in-situ annealing chamber enhancing adhesion and controlling texture of the Cu thin film.

* * * * *